United States Patent
Asano et al.

(10) Patent No.: US 7,298,020 B2
(45) Date of Patent: Nov. 20, 2007

(54) SEMICONDUCTOR DEVICE AND METHOD OF MANUFACTURING THE SAME

(75) Inventors: Syuji Asano, Nukata-gun (JP); Yoshiaki Nakayama, Okazaki (JP); Koji Eguchi, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 10/797,081

(22) Filed: Mar. 11, 2004

(65) Prior Publication Data
US 2004/0188770 A1  Sep. 30, 2004

(30) Foreign Application Priority Data
Mar. 31, 2003  (JP) .............. 2003-097248

(51) Int. Cl.
*H01L 29/00* (2006.01)
(52) U.S. Cl. ............... 257/536; 257/537; 257/E27.035
(58) Field of Classification Search ........ 257/536–539, 257/E27.035, E27.041, E21.004, 359, 379, 257/380, 581, E27.047, 904; 438/760, 330, 438/210, 384, 238
See application file for complete search history.

(56) References Cited

U.S. PATENT DOCUMENTS 6,194,775 B1* 2/2001 Usami ............... 257/536
6,441,447 B1* 8/2002 Czagas et al. ............. 257/379
2001/0053559 A1* 12/2001 Nagao et al. ............... 438/30
2002/0020879 A1 2/2002 Shiiki et al.

FOREIGN PATENT DOCUMENTS

| JP | A-2001-118844 | 4/2001 |
| JP | A-2002-368100 | 12/2002 |

* cited by examiner

*Primary Examiner*—Matthew C. Landau
(74) *Attorney, Agent, or Firm*—Posz Law Group, PLC

(57) ABSTRACT

A wire (12) is formed on an insulating film (10) on a semiconductor substrate (1). The wire (12) is covered by silicon nitride film (14), inorganic SOG film (20) and TEOS film (21). A thin film resistance element (30) of chromium silicon (CrSi) is formed on the upper surface of the TEOS film (21). The acute angle (taper angle) at which a line connecting the local maximum and minimum points of a step on the upper surface of the TEOS film (21) beneath the area where the thin film resistance element (30) is formed intersects to the surface of the substrate (1) is set to 10° or less.

11 Claims, 7 Drawing Sheets

SEMICONDUCTOR DEVICE AND METHOD OF MANUFACTURING THE SAME

CROSS REFERENCE TO RELATED APPLICATION

This application is based upon, claims the benefit of priority of, and incorporates by reference the contents of, Japanese Patent Application No. 2003-97248 filed on Mar. 31, 2003.

FIELD OF THE INVENTION

The present invention relates to a semiconductor device having thin film resistance elements and a method of manufacturing the same.

BACKGROUND OF THE INVENTION

In a process of manufacturing a semiconductor device having a semiconductor linear circuit which is a circuit using a bipolar transistor mainly, thin film resistance elements may be used for the purpose of fine adjustment, etc. of a circuit in the semiconductor device. That is, there is a case where at the final stage of the semiconductor device manufacturing process, thin film resistance elements having desired resistance values are formed in a manufactured circuit and used as a part of the circuit.

FIG. 9 schematically shows an example of the semiconductor device having thin film resistance elements as described above. In this case, thin film resistance elements 130 are formed in a field area which is located above first and second interlayer insulating films 110, 120 covering a semiconductor substrate 100 and in which any element such as a transistor or the like are not formed. In this field area, the upper surface of the second interlayer insulating film 120 is relatively flat, and thus the thin film resistance elements 130 can be formed in the field area so as to have a desired characteristic.

The formation of the thin film resistance elements 130 in the field area as described above causes an increase in the area of the semiconductor device.

In order to avoid the increase in the area of the semiconductor device, JP-A-2002-124639 (Patent Document 1) has proposed that the thin film resistance elements 130 are formed above an area where elements and wires are formed as shown in FIG. 10.

When the thin film resistance elements 130 are formed above the area where the elements and the wires are formed as described above, a step occurs on the upper surface of the second interlayer insulating film 120 shown in FIG. 10. When the thin film resistance elements 130 are formed on the interlayer insulating film 120 having the step, dispersion in resistance value is increased to a non-negligible level.

SUMMARY OF THE INVENTION

The present invention has been implemented in view of the foregoing situation, and has an object to provide a semiconductor device and a semiconductor device manufacturing method which can suitably suppress dispersion of the resistance values of thin film resistance elements even when the thin film resistance elements are formed above an area where elements and wires are formed.

In order to attain the above object, according to a semiconductor device of a first aspect of the present invention, an intersecting acute angle between the surface of a semiconductor substrate and a line connecting local maximum and minimum points of a step on the upper surface of an interlayer insulating film beneath an area where the thin film resistance elements are formed is set to 10° or less.

As the step on the upper surface of the interlayer insulating film is larger, the dispersion of the resistance values of the thin film resistance elements is increased. Particularly, it has been confirmed by the inventors that when the scale of the step is defined by the intersecting acute angle between the line connecting the local maximum and minimum points of the step and the surface of the semiconductor substrate, the dispersion of the resistance value increases sharply at and after the stage that the intersecting acute angle exceeds "10°".

According to the above construction, the dispersion of the resistance values of the thin film resistance elements can be properly suppressed by setting the acute angle to "10°" or less.

A semiconductor device according to a second aspect of the present invention is equipped with an inorganic spin-on-glass film as the interlayer insulating film, the inorganic spin-on-glass film being formed so as to cover the overall area below the area where the thin film resistance elements are formed.

In the above construction, the inorganic spin-on-glass film is used. The inorganic spin-on-glass film has no methyl group, and thus it hardly pollutes a plug in a via hole as compared with an organic spin-on-glass film. Accordingly, when a via hole is formed in the inorganic spin-on-glass film, the upper and lower layers of the inorganic spin-on-glass film can be brought into contact with each other through the via hole and pollution in the via hole can be suppressed. Therefore, the overall area below the area where the thin film resistance elements are formed can be covered by the inorganic spin-on-glass film. In this case, the upper surface of the inorganic spin-on-glass film can be properly flattened by rotational coating.

In a semiconductor device according to a third aspect of the present invention, the interlayer insulating film comprises an inorganic spin-on-glass film and an insulating film of a lower layer of the inorganic spin-on-glass film. The insulating film of the lower layer is designed so that the upper surface of an area of the insulating film which is adjacent to an area of the insulating film above which the thin film resistance elements are formed (hereinafter referred to as "thin film resistance element formed area") is higher than the upper surface of the thin film resistance element formed area of the insulating film.

In the above construction, when the inorganic spin-on-glass film is coated by rotational coating, the material of the inorganic spin-on-glass film flows to an area below the area where the thin film resistance elements are formed. Accordingly, the upper surface of the interlayer insulating film beneath the area where the thin film resistance elements are formed can be properly flattened by using the inorganic spin-on-glass film.

In addition, the inorganic spin-on-glass film has no methyl group, and thus it hardly pollutes a plug in a via hole as compared with an organic spin-on-glass film. Accordingly, when a via hole is formed in the inorganic spin-on-glass film, the upper and lower layers of the inorganic spin-on-glass film can be brought into contact with each other through the via hole. Therefore, the overall area below the area where the thin film resistance elements are formed can be covered by the inorganic spin-on-glass film. In this case, the upper of the inorganic spin-on-glass film can be properly flattened by rotational coating.

In a semiconductor device according to a fourth aspect of the present invention, the thin film resistance elements are formed above an area where the wires are formed, and the interval of the wires is set to "1.7 µm" or more.

As the interval of the wires formed below the area where the thin film resistance elements are formed is narrower, the dispersion of the resistance values of the thin film resistance elements is liable to increase. Particularly, it has been confirmed by the inventors that when the interval of the wires is set to "1.7 µm" or more, the intersecting acute angle between the surface of the semiconductor substrate and the line connecting the local maximum and minimum points of the step on the upper surface of the interlay insulating film can be more easily set to "10°" or less.

Accordingly, in the above construction, the dispersion of the resistance value can be properly suppressed by setting the interval of the wires to "1.7 µm" or more.

In a semiconductor device according to a fifth aspect of the present invention, the thin film resistance elements are formed above the area where the wires are formed, and each thin film resistance element and each wire are disposed in parallel to each other so that the projections thereof are substantially overlapped with each other.

In the above construction, by forming the thin film resistance elements and the wires so that they are disposed in parallel to each other and the projections thereof are substantially overlapped with each other, occurrence of steps on the bottom surfaces of the thin film resistance elements in accordance with the presence or absence of the wires can be properly avoided.

Furthermore, in a semiconductor device according to a sixth aspect of the present invention, inorganic spin-on-glass film formed so as to cover the overall area below the area where the thin film resistance elements are formed is equipped as the interlayer insulating film.

In the above construction, the inorganic spin-on-glass film is used. The inorganic spin-on-glass film has no methyl group, and thus it hardly pollutes a plug in a via hole as compared with an organic spin-on-glass film. Accordingly, when a via hole is formed in the inorganic spin-on-glass film, the upper and lower layers of the inorganic spin-on-glass film can be brought into contact with each other with suppressing pollution in the via hole. Therefore, the inorganic spin-on-glass film can be formed so as to cover the overall area below the area where the thin film resistance elements are formed. In this case, the upper surface of the inorganic spin-on-glass film can be properly flattened by rotational coating. In addition, the dispersion of the resistance values of the thin film resistance elements can be properly suppressed.

A semiconductor device manufacturing method according to a seventh aspect of the present invention comprises a step of rotationally coating an inorganic spin-on-glass film to form the inorganic spin-on-glass film as an interlayer insulating film while flattening the upper surface of the inorganic spin-on-glass film, and a step of forming any one of the thin film resistance element and the insulating film constituting the interlayer insulating film on the inorganic spin-on-glass film flattened by the rotational coating.

In the above manufacturing method, the inorganic spin-on-glass film is used. The inorganic spin-on-glass film has no methyl group, and thus it hardly pollutes a plug in a via hole as compared with an organic spin-on-glass film. Accordingly, when a via hole is formed in the inorganic spin-on-glass film, the upper and lower layers of the inorganic spin-on-glass film can be brought into contact with each other and pollution in the via hole can be suppressed.

Therefore, in the step of forming the inorganic spin-on-glass film, the inorganic spin-on-glass film can be formed so as to cover the overall area below the area where the thin film resistance elements are formed. Any one of the thin film resistance element and the insulating film constituting the interlayer insulating film can be directly formed on the upper surface of the inorganic spin-on-glass film flattened by the rotational coating without subjecting the upper surface of the inorganic spin-on-glass film to a treatment such as etching or the like.

Accordingly, according to the manufacturing method described above, the dispersion of the resistance values of the thin film resistance elements can be properly suppressed.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

Preferred embodiments according to the present invention will be described hereunder with reference to the accompanying drawings.

First Embodiment

A first embodiment of a semiconductor device and a method of manufacturing the semiconductor device according to the present invention will be described with reference to the accompanying drawings.

Figure 1:
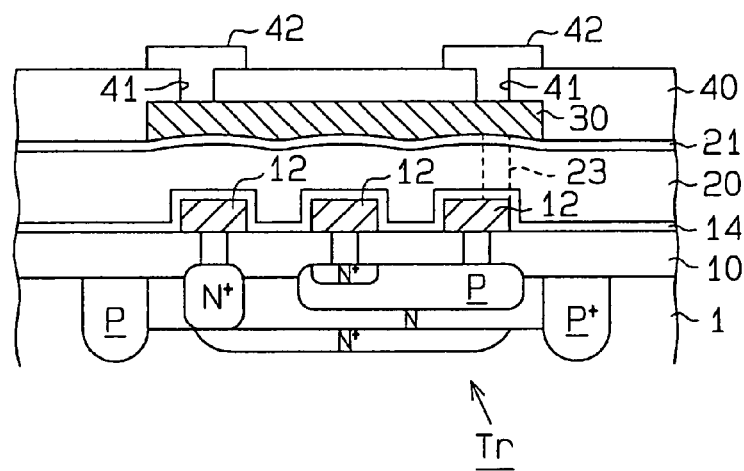
FIG. 1 is a cross-sectional view of a semiconductor device according to a first preferred embodiment.

FIG. 1 is a cross-sectional view of the semiconductor device according to a preferred embodiment. The device includes an insulating film 10 such as a silicon oxide film or the like formed on a semiconductor substrate 1 in which an element such as a bipolar transistor Tr or the like is formed. Wires 12 are formed on the insulating film 10. The upper and side surfaces of the wires 12 are covered by a silicon nitride film 14 except for a contact site thereof which will be brought into electrical contact with the upper layer. The silicon oxide film 14 is provided to protect the wires 12. Furthermore, an inorganic spin-on-glass film (inorganic SOG film) 20 is formed on the silicon nitride film 14, and a TEOS (tetraethylorthosilicate) film 21 is formed on the inorganic spin-on-glass film 20. The TEOS film 21 serves as a protection film for covering the surface of the inorganic SOG 20 because the inorganic SOG film 20 has high hygroscopicity.

Thin film resistance elements 30 formed of chromium silicon (CrSi) are formed on the upper surface of the TEOS film 21, and an insulating film 40 such as a silicon nitride film or the like is formed so as to cover the thin film resistance elements 30. Via holes 41 are formed in the insulating film 40, and the thin film resistance elements 30 are brought into contact with wires 42 on the insulating film 40 through the via holes 41.

In the semiconductor device of this embodiment in which a semiconductor linear circuit using a bipolar transistor mainly is mounted, the thin film resistance elements 30 are used to carry out fine adjustment, etc. on the semiconductor linear circuit. In this embodiment, the thin film resistance elements 30 are formed above an area where elements such as a bipolar transistor Tr, etc. and wires 12 are formed, thereby suppressing increase of the area of the semiconductor device concerned.

Here, with respect to a step occurring on the upper surface of the TEOS film 21, the acute angle (taper angle) at which a line connecting the local maximum and minimum points of the step intersects to the surface of the semiconductor substrate 1 is set to "10°" or less. This will be described hereunder with reference to FIGS. 2A to 2C.

Figure 2A:
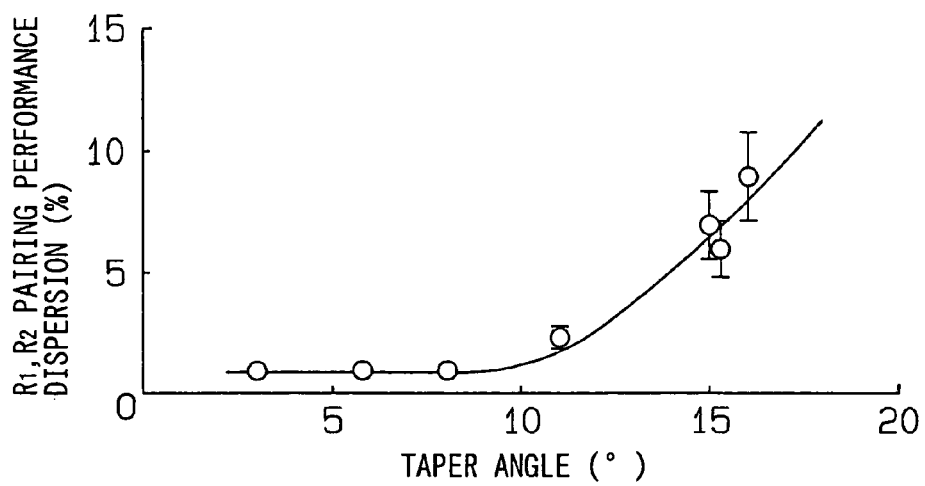
FIGS. 2A to 2C are diagrams showing the relationship between the dispersion of "pairing performance" of thin film resistance elements and a step of an insulating film below the element.
Figure 2B:
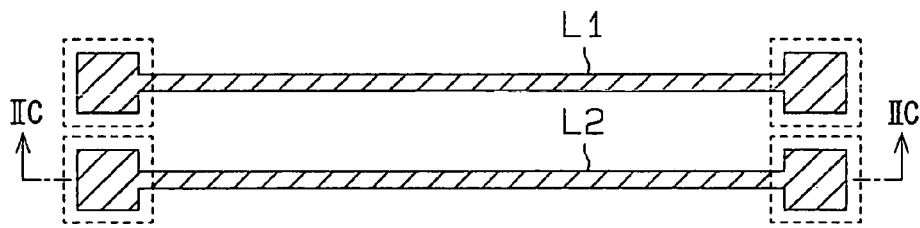
Figure 2C:
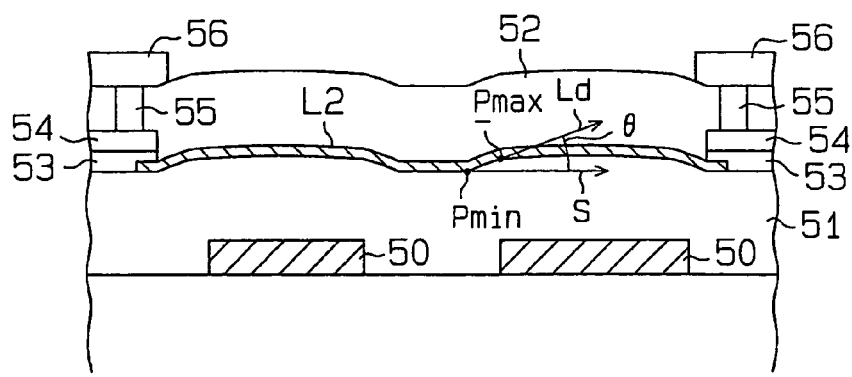

FIG. 2A is a graph of experimental data showing the relationship between the dispersion of the resistance values of the thin film resistance elements and the taper angle for the step on the upper surface of the interlayer insulating film beneath the area where the thin film resistance elements are formed. Each plot (o) in FIG. 2A represents the average of plural measurement values for the dispersion of pairing performance, and the actual measurement values for each plot o are located over an area indicated by the line segment penetrating through the plot o. FIG. 2B shows a pair of thin film resistance elements L1 and L2 which are formed to have the same shape and used for the above experiment. FIG. 2C is a cross-sectional view taken along line IIC-IIC of FIG. 2B.

Here, the dispersion of the resistance values of the thin film resistance elements is defined as the dispersion in resistance value between the thin film resistance elements L1 and L2 formed in the same shape (line width of "1 to 10 μm", film thickness of "10 to 50 nm") (dispersion of pairing performance). That is, when the resistance values measured for the thin film resistance elements L1, L2 are represented by R1, R2 respectively, the dispersion of pairing performance is defined as follows:

$(R1-R2)\{(R1+R2)/2\} \times 100$

Referring to FIG. 2C, the thin film resistance elements L1, L2 used in this experiment are formed in the same process including a film forming step based on sputtering and a patterning step based on a lithography technique. These thin film resistance elements L1, L2 are formed through the interlayer insulating film 51 above the area where the wires 50 are formed so that they are substantially orthogonal to the wires 50. The upper surfaces of the thin film resistance elements L1, L2 are covered by the interlayer insulating film 52. The thin film resistance elements L1 and L2 are connected through barrier layers 53, 54 and plugs 55 to the wires 56 on the interlayer insulating film 52.

The taper angle is defined as an acute angle θ at which a line Ld connecting the local minimum point Pmin and the local maximum point Pmax of a step on the upper surface of the interlayer insulating film 51 intersects to a plane S parallel to the semiconductor substrate. Here, the local maximum point Pmax and the local minimum point Pmin are defined as the local maximum and minimum points of a step caused by a member (in this case, a wire 50) formed below the interlayer insulating film 51. In the experiment shown in FIG. 2A, the taper angle is determined by achieving the local maximum point and the local minimum point from a photograph of the cross-section of a device as an experiment target.

It is apparent from FIG. 2A that the dispersion of pairing performance increases sharply at and after the stage that the taper angle exceeds "10°". Therefore, in this embodiment, the taper angle for the step on the upper surface of the TEOS film 21 shown in FIG. 1 is set to "10°" or less.

Next, a manner of equipping the member formed below the thin film resistance elements to implement the above setting will be described.

Figure 3A:
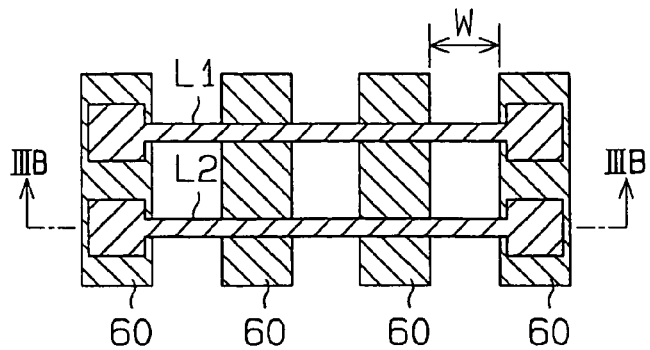
FIGS. 3A to 3D are diagrams showing the relationship between each of the dispersion of "pairing performance" of the thin film resistance elements and the step of the insulating film below the element and the interval of metal film formed below the thin film resistance elements.
Figure 3B:
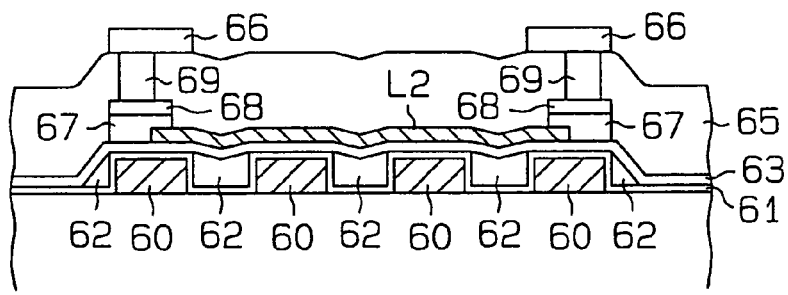

Referring to FIG. 3A, in this case, plural metal films 60 of aluminum are equipped in parallel to one another below the thin film resistance elements L1, L2 for which the dispersion of pairing performance is to be measured so that the metal films 60 are disposed to be substantially orthogonal to the thin film resistance elements L1, L2. Then, these metal films 60 are covered by silicon nitride film 61 as shown in FIG. 3B (which is a cross-sectional view of FIG. 3A along line IIIB-IIIB). Furthermore, an organic SOG film 62 is formed between the respective metal films 60 so as to compensate for the step between the respective metal films 60. The upper side of the organic SOG films 62 and the silicon nitride film 61 are covered by an TEOS film 63 of 200 to 400 nm in film thickness. Thereafter, the thin film resistance elements L1, L2 are formed on the TEOS film 63. The thin film resistance elements L1, L2 are formed in the same process having the film formation step based on sputtering and the patterning step based on the lithography technique. Furthermore, the thin film resistance elements L1, L2 are covered by the interlayer insulating film 65, and the thin film resistance elements L1, L2 and the electrodes 66 on the interlayer insulating film 65 are connected to one another through barrier layers 67, 68 and plugs 69.

Figure 3C:
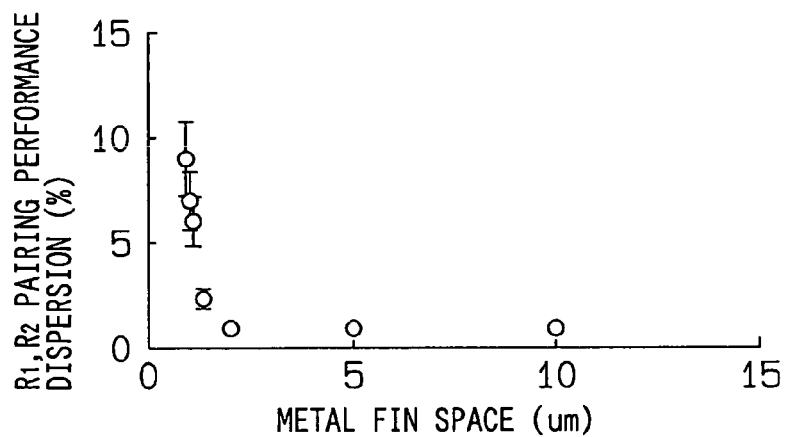

Under the condition described above, the dispersion of pairing performance when the interval of the metal films 60 (represented by W in FIG. 3A) is varied in the range from 0.8 μm to 10 μm is shown in FIG. 3C. As shown in FIG. 3C, as the interval of the metal films 60 is larger, the dispersion of pairing performance is reduced more greatly. A plot o in FIG. 3C represents the average value of plural measurement values for the dispersion of pairing performance, and the actual measurement values of each plot are located over the area indicated by a line segment penetrating through the plot (o).

Figure 3D:
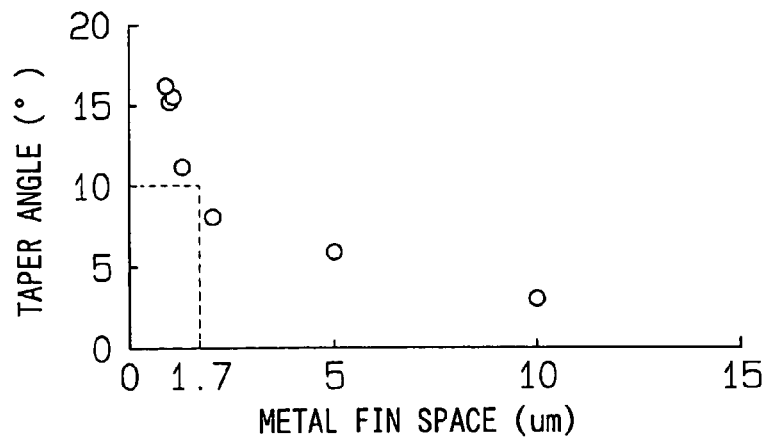

FIG. 3D is a graph showing taper angles for steps in areas beneath the thin film resistance elements L1, L2 on the upper surface of the TEOS film 63 when the interval of the metal films 60 is varied in the range from 0.8 μm to 10 μm. As shown in FIG. 3D, as the interval of the metal films 60 is larger, the taper angle is reduced more greatly.

From the foregoing description, it can be concluded that the dispersion of pairing performance is increased due to reduction of the interval of the metal films 60 because the reduction of the interval of the metal films 60 causes increase of the taper angle for the steps in the areas beneath the thin film resistance elements L1, L2 on the upper surface of the TEOS film 63. It can be estimated that this phenomenon occurs because when the interval of the metal films 60 is narrow, the patterning precision in the lithographing step and the subsequent etching step during the process of forming respective members on the metal films 60 is more greatly reduced as a patterning target is denser.

Accordingly, in order to reduce the dispersion of pair performance by reducing the taper angle, it is effective to increase the interval of the metal films 60. Particularly, it is apparent from FIG. 3D that when the interval of the metal films 60 is set to 1.7 μm or more, the taper angle can be set to 10° or less.

Furthermore, according to the present invention, the inorganic SOG film 20 is equipped as the interlayer insulating film formed between each wire 12 and each thin film resistance elements 30 as shown in FIG. 1. This inorganic SOG film 20 has no methyl group, and thus it hardly pollutes the plug in the via hole as compared with the organic SOG film. Accordingly, when the inorganic SOG film 20 is used, even when a via hole 23 through which the upper and lower layers thereof are brought into contact with each other is formed as indicated by a broken line of FIG. 1, the plug in the via hole 23 can be suitably avoided from being polluted.

Therefore, as shown in FIG. 1, the inorganic SOG film 20 can be formed so as to cover the overall area below the area where the thin film resistance elements 30 are formed. Furthermore, in the area below the area where the thin film resistance elements 30 are formed, the inorganic SOG film 20 can be formed so that the upper surface thereof can be set to be higher than the upper surfaces of the wires 12 causing the steps on the upper surface of the TEOS film 21 even at the lowest position of the upper surface of the inorganic SOG film 20. Accordingly, the flattening of the upper surface of the TEOS film 21 beneath the area where the thin film resistance elements 30 are formed can be promoted by using the inorganic SOG film 20.

On the other hand, if the organic SOG film has a methyl group, it might pollute the plug in the via hole if the organic SOG film comes into contact with the via hole. Therefore, when the organic SOG film is used to compensate for the steps of the elements and the wires, the organic SOG film is ordinarily formed on the side surfaces of the elements and the wires so that the organic SOG film does not come into contact with the via hole as shown in FIG. 3B. However, when the organic SOG film is formed in the above style, over-etching is carried out to surely avoid the contact between the organic SOG film and the via hole, and thus the flattening of the upper surface of the elements and the wires is not necessarily sufficiently performed.

Figure 4:
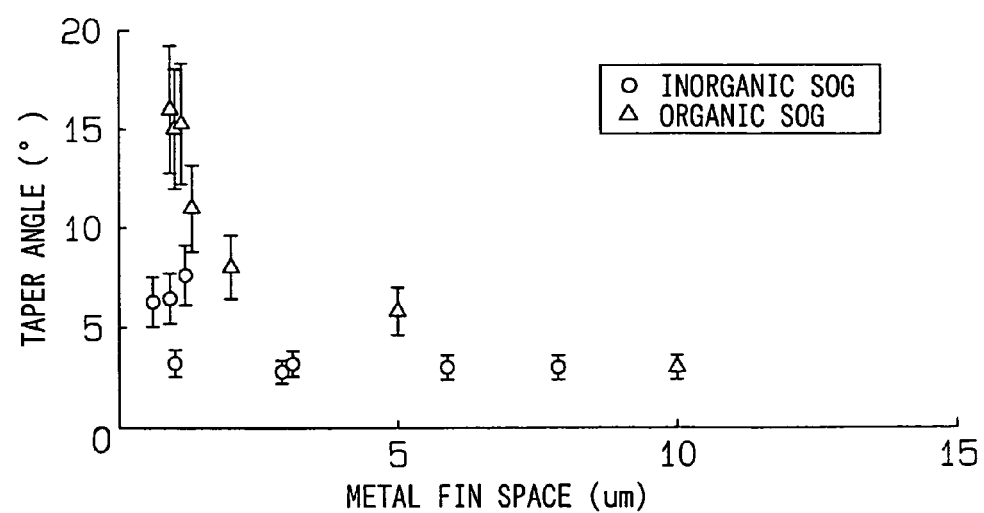
FIG. 4 is a graph showing the comparison between characteristics of semiconductor devices when an inorganic SOG film and an organic SOG film are used as the interlayer insulating film.

FIG. 4 shows the relationship between the interval of the metal films formed below the area where the thin film resistance elements are formed, and the taper angle of the interlayer insulating film beneath the area where the thin film resistance elements are formed. Plots o and Δ in FIG. 4 show the average values of plural measurement values for the dispersion of pairing performance in the case of use of the inorganic SOG film and the organic SOG film, respectively. The actual measurement values are located over an area indicated by a line segment penetrating through each plot in FIG. 4. In the case of use of the inorganic SOG film, the construction shown in FIG. 1 is used, and in the case of use of the organic SOG film, the construction shown in FIG. 3B is used.

As shown in FIG. 4, the taper angle of the interlayer insulating film beneath the area where the thin film resistance elements are formed can be more easily reduced in the case of the inorganic SOG film than in the case of the organic SOG film.

In FIG. 4, the taper angle is equal to "10°" or less irrespective of the metal film interval at all times in the case of use of the inorganic SOG film, however, this is satisfied in the case where the setting shown in FIG. 1 is carried out. That is, this is satisfied in the case where in the area below the area where the thin film resistance elements 30 are formed, the upper surface of the inorganic SOG film 20 is set to be higher than the upper surfaces of the wires 12 even at the lowest position of the upper surface of the inorganic SOG film 20. Accordingly, in the case where the film thickness is extremely small, the taper angle is not necessarily equal to 10° or less even when the inorganic SOG film is used. Accordingly, even when the inorganic SOG film is used, it is favorable to properly consider the interval of the metal films and the laying direction of the metal films in order to set the taper angle to 10° or less.

Here, the manufacturing process of the semiconductor device according to this embodiment will be described with reference to FIGS. 5A-5E.

Figure 5A:
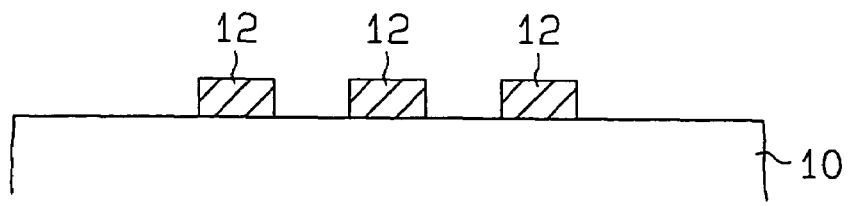
FIGS. 5A to 5E are cross-sectional views showing a manufacturing process according to an embodiment.
Figure 5B:
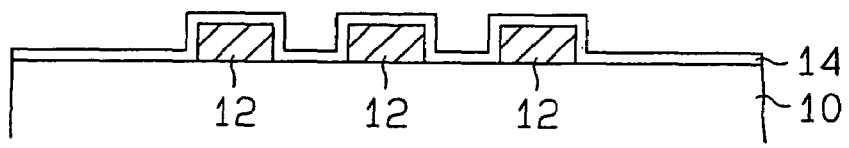
Figure 5C:
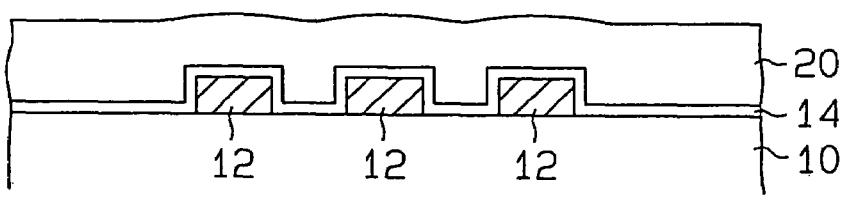

In this series of steps, wires 12 formed of aluminum or the like are first formed on the insulting film 10 in a step of FIG. 5A. Thereafter, the wires 12 are covered by a silicon nitride film 14 in a subsequent step of FIG. 5B. In a step of FIG. 5C, the material of the inorganic SOG film is rotationally coated and then stepwise subjected to a baking treatment of 100 to 250° C. and a baking treatment of 300 to 350° to thereby form the inorganic SOG film 20.

As described above, by rotationally coating the inorganic SOG film 20, the effect of the steps of the wires 12 is moderated on the upper surface of the inorganic SOG film 20.

Figure 5D:
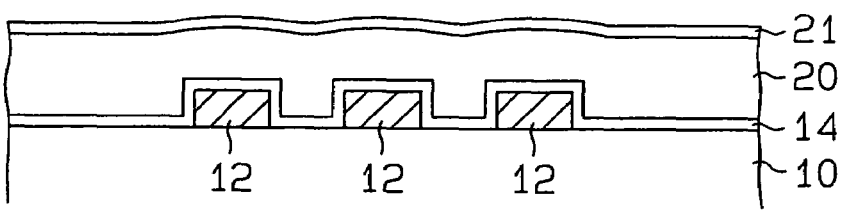
Figure 5E:
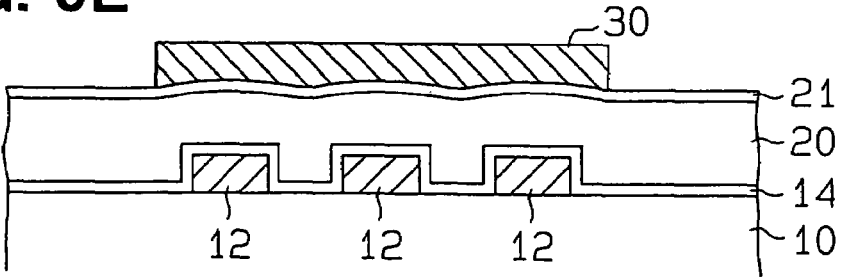

Furthermore, in a step of FIG. 5D, the TEOS film 21 is formed on the inorganic SOG film 20 by a chemical vapor deposition method using plasma method (plasma CVD method). Thereafter, in a step of FIG. 5E, chromium silicon (CrSi) film is formed by sputtering and then subjected to patterning by using the lithography technique to form the thin film resistance elements 30.

According to the first embodiment described above, the following effects can be achieved.

(1) By setting the taper angle to 10° or less, the dispersion of the resistance value can be properly suppressed.

(2) The inorganic SOG film 20 is used as the interlayer insulating film. The inorganic SOG film 20 can be formed so as to cover the overall area below the area where the thin film resistance elements 30 are formed, and thus the step occurring on the TEOS film 21 beneath the area where the thin film resistance elements 30 are formed can be properly suppressed.

Second Embodiment

Next, a second preferred embodiment will be described with reference to the accompanying drawings while concentrating on the different points from the first embodiment.

Figure 6:
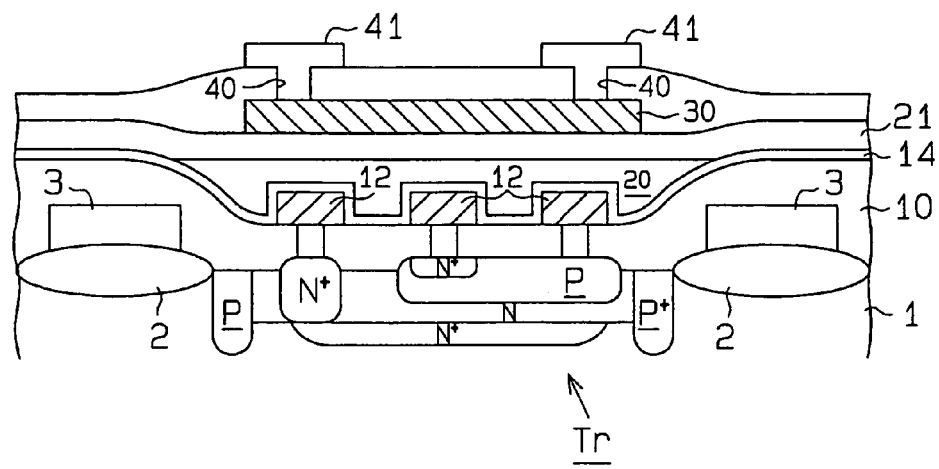
FIG. 6 is a cross-sectional view of the semiconductor device according to a second preferred embodiment.

FIG. 6 shows the construction of a semiconductor device according to the second embodiment. In FIG. 6, the same members as those of FIG. 1 are represented by the same reference numerals for the sake of convenience.

As shown in FIG. 6, according to this embodiment, the upper surfaces of the silicon nitride film 14 serving as the insulating film and the insulating film 10 which are formed in the lower layer of the inorganic SOG film 20 are set so that the upper surfaces of the insulating films 14 and 10 in an area adjacent to an area above which the thin film resistance elements 30 are formed is set to be higher than those in the area where the thin film resistance elements 30 are formed. Therefore, when the inorganic SOG film 20 is rotationally coated, the inorganic SOG film 20 flows to the area below the area where the thin film resistance elements 30 are formed. Accordingly, the flattening of the area beneath the area where the thin film resistance elements 30 are formed can be promoted by using the inorganic SOG film 20.

According to this embodiment, a field oxide film 2 and a polysilicon film 3 are used to set the upper surface of the silicon nitride film 14 in the above style. That is, in order to separate the elements on the semiconductor substrate 1, the field oxide film 2 is formed by the LOCOS method, and then the polysilicon film 3 is formed on the field oxide film 2, whereby the upper surfaces of the silicon nitride film 14 and insulating film 10 can be set to be higher than the upper surfaces of the wires 12 on the field oxide film 2 and the polysilicon film 3. Accordingly, the upper surface of the inorganic SOG film 20 can be formed-so as to be higher than the upper surfaces of the wires 12.

According to the second embodiment described above, the following effect can be achieved in addition to the effects (1) and (2) of the first embodiment.

(3) The upper surfaces of the silicon nitride film 14 serving as the insulating film and the insulating film 10 which are formed in the lower layer of the inorganic SOG film 20 can be set to be higher in an area adjacent to an area above which the thin film resistance elements 30 are formed than in the area above which the thin film resistance elements 30 are formed. Accordingly, the flattening of the area beneath the area where the thin film resistance elements 30 are formed can be promoted by using the inorganic SOG film 20.

Third Embodiment

Figure 7:
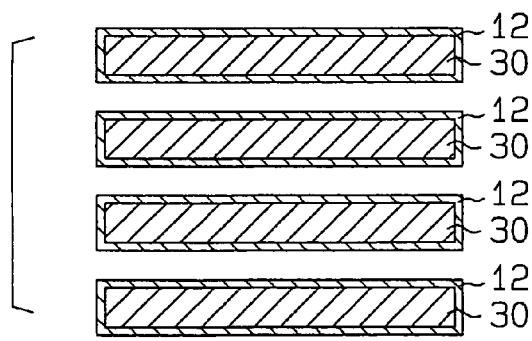
FIG. 7 is a plan view of the semiconductor device according to a third preferred embodiment.

Referring to FIG. 7, a third preferred embodiment will be discussed by concentrating on the different points from the first embodiment. In this embodiment, the same members as those of the first embodiment are represented by the same reference numerals for the sake of convenience.

In the first embodiment, each thin film resistance elements 30 and each wire 12 are laid so as to be substantially orthogonal to each other. On the other hand, in this embodiment, each thin film resistance element 30 and each wire 12 are formed so as to be disposed in parallel to each other and so that the projections thereof are substantially overlapped with each other. Specifically, the projections of the thin film resistance elements 30 are accommodated in the wires 12.

Accordingly, occurrence of any step in the TEOS film 21 in accordance with the presence or absence of the wire 12 can be properly avoided in the area beneath the area where the thin film resistance elements 30 are formed.

Figure 8:
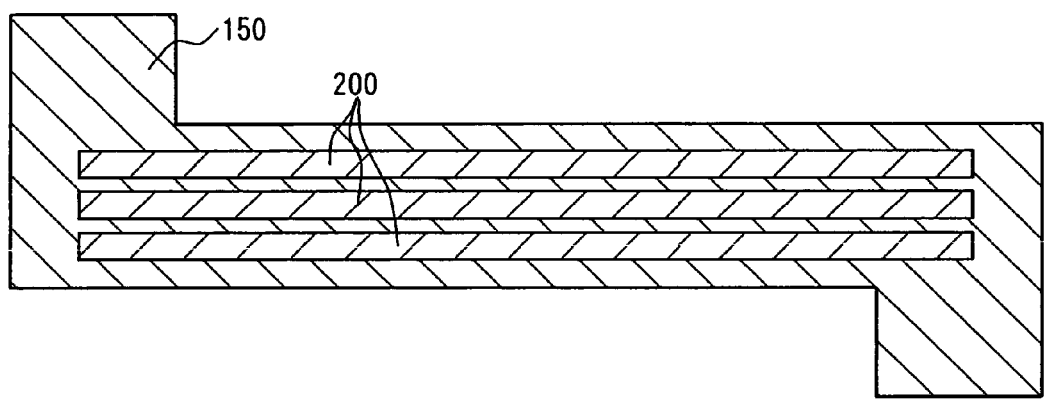
FIG. 8 is a modification of the third embodiment of FIG. 7 according to the present invention.
Figure 9:
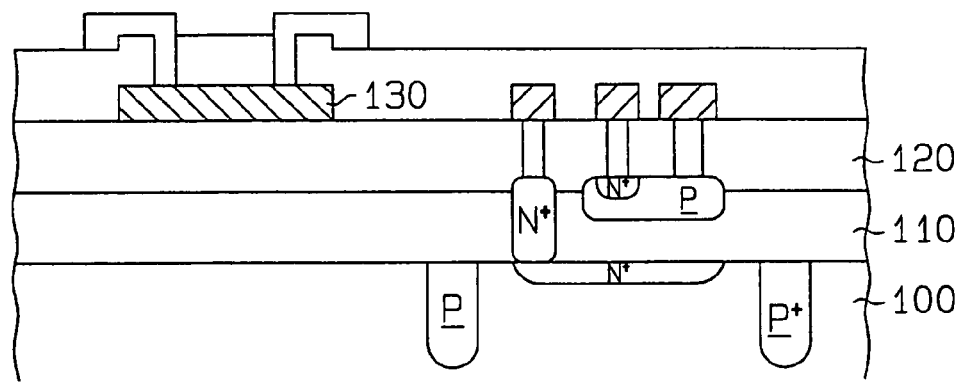
FIG. 9 is a cross-sectional view of a related art semiconductor device.
Figure 10:
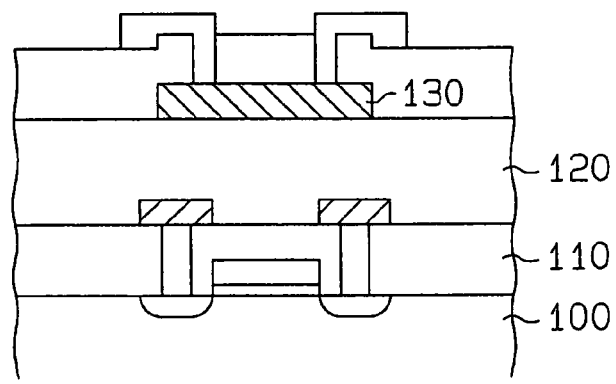
FIG. 10 is a cross-sectional view of a conventional semiconductor device.

FIG. 8 shows a modification of the third embodiment of the present invention according to the present invention.

In this modification, plural thin film resistance elements 200 are arranged on a metal wiring film 150 containing a power supply line, a ground line, etc. Furthermore, an interlayer insulating film formed of an insulating film such as TEOS, SOG or the like is interposed between the metal wiring film and each thin film resistance element. With this construction, the pairing performance of the thin film resistance elements can be secured.

This modification is assumed to be applied to a circuit in which a power supply line and a GND line which have a relatively large wiring width are equipped in a chip. However, this modification may be also applied to an electrode of an MDS capacitor or metal capacitor which has a relatively large area.

As described above, according to this embodiment, the following effect can be achieved in addition to the effects (1) and (2) of the first embodiment.

(4) The thin film resistance elements 30 and the wires 12 are formed so that they are disposed in parallel to each other and the projections thereof are substantially overlapped with each other, whereby occurrence of any step on the TEOS film 21 due to the presence and absence of wires 12 can be properly avoided.

The thin film resistance elements according to the present invention are suitably used as a resistance group needing pairing performance or unit performance like resistors for an input of an operational amplifier (for creating a reference voltage), for example.

Furthermore, when the thin film resistance elements are disposed on a metal wire film or electrode like in the modification of the third embodiment, it is preferable that resistance elements used as a pair are equipped on a wire/electrode to which the same potential is applied. This is because even when these paired resistance elements suffer an effect of potential, the effects on these resistance elements are the same level, and thus these effects can be offset with each other.

The above-described embodiments may be modified as follows.

The material of the thin film resistance elements is not limited to chromium silicon (CrSi). For example, it may be formed of CrSiON, $SnO_2$, CrSiN, NiCr, Ta, Cr, CrTi, Ti, TiAl, TiN, Re, $\beta$-FaSi, monocrystal silicon, polycrystal silicon, Wsi, W, TaN, Mo-Si, laminate film of Ti and TiN, laminate film of Ti and WN or the like.

The interlayer insulating film equipped between each wire and each thin film resistance element is not limited to the above embodiments. The interlayer insulating film is preferably to be equipped with inorganic SOG film.

In the first and second embodiments, the wires are equipped through the interlayer insulating film in the area below the area where the thin film resistance elements are formed. In place of the wires, elements (devices) may be formed. That is, in the construction of FIG. 1, elements such as bipolar transistors Tr or the like may be equipped below the thin film resistance elements 30 in place of the wires 12. In this case, there may occur dispersion in resistance values of the thin film resistance elements due to some step caused by the elements. Therefore, the setting of the interlayer insulating film like the first and second embodiments is effective.

In the second embodiment described above, the formation area of the inorganic SOG film is not limited to only the area below the area where the thin film resistance elements 30 are formed as shown in FIG. 6, and it may be formed on the whole surface of the semiconductor substrate 1.

In the second embodiment described above, the means of setting the height of the upper surface of the insulating film of the lower layer of the inorganic SOG film so that the upper surface of the insulating film in an area adjacent the area of the insulating film below the thin film resistance element formed area is higher than that in the thin film resistance element formed area is not limited to the embodiments of FIG. 6. In short, with respect to the insulating film of the lower layer, in order to make the area adjacent to the area below the thin film resistance element formed area higher than the area below the thin film resistance element formed area, the adjacent area may be properly equipped with a step adjusting means.

Even when no inorganic SOG film is used, the taper angle for the step on the upper surface of the interlayer insulting film beneath the area where the thin film resistance elements are formed can be set to 10° or less by the construction of the third embodiment or by sufficiently separating the metal films from each other as shown in FIG. 4.

In the first and second embodiments, the wires 12 and the thin film resistance elements 30 are disposed so as to be substantially orthogonal to each other, however, the arrangement of these elements and wires is not limited to this embodiment.

In the above-described embodiments, the present invention is applied to a semiconductor device having a semiconductor linear circuit which is a circuit using a bipolar transistor mainly. However, the present invention is not limited to this circuit, and it may be a semiconductor device having a CMOS circuit mounted therein.

What is claimed is:

1. A semiconductor device having a plurality of thin film resistance elements located above an interlayer insulating film above an area where at least one of an element and a wire is formed on a semiconductor substrate, wherein a taper angle at which a line connecting the local maximum and minimum points of a step on the upper surface of the interlayer insulating film beneath an area where the plurality of thin film resistance elements is formed intersects to the surface of the semiconductor substrate is set to be within a range that is greater than 0° and less than or equal to 10°, wherein each of the plurality of thin film resistance elements has a similar shape, wherein the interlayer insulating film includes an inorganic spin-on-glass film and a tetraethylorthosilicate film covering a surface of the inorganic spin-on-glass film.

2. The semiconductor device according to claim 1, wherein the inorganic spin-on-glass film is formed so as to cover the overall area below the area where the plurality of thin film resistance elements is formed.

3. The semiconductor device according to claim 1, wherein the plurality of thin film resistance elements is formed above an area where a plurality of wires is formed, and a wire interval is set to 1.7 μm or more.

4. The semiconductor device according to claim 1, wherein the plurality of thin film resistance elements is formed above the area where the wire is formed, and the plurality of thin film resistance elements and the wire are disposed in parallel to each other so that projections thereof are overlapped with each other.

5. The semiconductor device according to claim 1, wherein the plurality of thin film resistance elements further comprises paired thin film resistance elements.

6. The semiconductor device according to claim 1, wherein each of the plurality of thin film resistance elements comprises chromium silicon.

7. A semiconductor device having a plurality of thin film resistance elements located above an interlayer insulating film above an area where at least one of an element and a wire is formed on a semiconductor substrate, wherein a taper angle at which a line connecting the local maximum and minimum points of a step on the upper surface of the interlayer insulating film beneath an area where the plurality of thin film resistance elements is formed intersects to the surface of the semiconductor substrate is set to be within a range that is greater than 0° and less than or equal to 10°, wherein each of the plurality of thin film resistance elements has a similar shape, wherein the interlayer insulating film includes an inorganic spin-on-glass film and a tetraethylorthosilicate film covering a surface of the inorganic spin-on-glass film, wherein an upper surface of the interlayer insulating film has a higher area adjacent to an area where the plurality of thin film resistance elements is formed than in the area where the plurality of thin film resistance elements is not formed.

8. The semiconductor device according to claim 7, wherein each of the plurality of thin film resistance elements is formed to have a width in a range between 1 and 10 μm, and a thickness in a range between 10 and 50 nm.

9. A semiconductor device having a plurality of thin film resistance elements disposed above an interlayer insulating film above an area where at least one of an element and a plurality of wires is formed on a semiconductor substrate, wherein a taper angle at which a line connecting the local maximum and minimum points of a step on the upper surface of the interlayer insulating film beneath an area where the plurality of thin film resistance elements is formed intersects to the surface of the semiconductor substrate is set to be greater than 0° and less than or equal to 10°, wherein the interlayer insulating film comprises an inorganic spin-on-glass film and a tetraethylorthosilicate film, wherein the inorganic spin-on-glass film is formed so as to cover the overall area below the area where the thin film resistance element is formed, wherein the plurality of thin film resistance elements is formed on an area where the plurality of wires is formed, and a wire interval is set to 1.7 μm or more, wherein each of the plurality of thin film resistance elements has a similar shape, wherein the tetraethylorthosilicate film is formed to cover a surface of the inorganic spin-on-glass film.

10. The semiconductor device according to claim 9, wherein each of the plurality of thin film resistance elements is formed to have a width in a range between 1 and 10 μm, and a thickness in a range between 10 and 50 nm.

11. A semiconductor device having a plurality of thin film resistance elements disposed above an interlayer insulating film above an area where a plurality of wires is formed on a semiconductor substrate, wherein a taper angle at which a line connecting the local maximum and minimum points of a step on the upper surface of the interlayer insulating film beneath an area where the plurality of thin film resistance elements is formed intersects to the surface of the semiconductor substrate is set to be greater than 0° and less than or equal to 10°, wherein the interlayer insulating film comprises an inorganic spin-on-glass film and a tetraethylorthosilicate film covering a surface of the inorganic spin-on-glass film, wherein a wire interval is set to 1.7 μm or more, wherein each of the plurality of thin film resistance elements has a similar shape.

* * * * *